United States Patent
Lundvall

(10) Patent No.: US 9,573,353 B2
(45) Date of Patent: Feb. 21, 2017

(54) METHOD FOR MANUFACTURING OF PRINTED PRODUCT MICRO FEATURES AND ARRANGEMENT FOR CONTINUOUS PRODUCTION OF SUCH A PRODUCT

(71) Applicant: ROLLING OPTICS AB, Solna (SE)

(72) Inventor: Axel Lundvall, Bjursås (SE)

(73) Assignee: Rolling Optics AB, Solina (SE)

( * ) Notice: Subject to any disclaimer, the term of this patent is extended or adjusted under 35 U.S.C. 154(b) by 67 days.

(21) Appl. No.: 14/440,303

(22) PCT Filed: Oct. 25, 2013

(86) PCT No.: PCT/SE2013/051253
§ 371 (c)(1),
(2) Date: May 1, 2015

(87) PCT Pub. No.: WO2014/070079
PCT Pub. Date: May 8, 2014

(65) Prior Publication Data
US 2015/0360453 A1 Dec. 17, 2015

(30) Foreign Application Priority Data
Nov. 2, 2012 (SE) ........................................ 1251247

(51) Int. Cl.
*B32B 37/00* (2006.01)
*B29D 11/00* (2006.01)
(Continued)

(52) U.S. Cl.
CPC ....... *B32B 37/025* (2013.01); *B29D 11/00288* (2013.01); *B41F 9/00* (2013.01);
(Continued)

(58) Field of Classification Search
CPC ........ B32B 37/00; B32B 37/02; B32B 37/025;
B29D 11/00; B29D 11/002; B29D 11/0028; B29D 11/00288; B41F 9/00; B41M 1/00; B41M 1/10; G02B 3/00; G02M 3/003; G02M 3/0031; G03F 7/00; G03F 7/0002; B29C 65/00
See application file for complete search history.

(56) References Cited

U.S. PATENT DOCUMENTS

2005/0276919 A1 12/2005 Truskett et al.
2009/0145314 A1* 6/2009 Botrie ...................... B41F 9/00
101/153

(Continued)

FOREIGN PATENT DOCUMENTS

CN 101221358 A 7/2008
EP 1 211 096 A1 6/2002
(Continued)

*Primary Examiner* — Michael N Orlando
*Assistant Examiner* — Matthew Hoover
(74) *Attorney, Agent, or Firm* — Birch, Stewart, Kolasch & Birch, LLP

(57) ABSTRACT

A method for manufacturing a printed product comprises provision (210) of a matrix comprising a matrix surface having a plurality of recesses. A first curable compound is applied (212) to the matrix surface to fill the recesses with the compound. The matrix surface and the filled recesses are covered (220) by a pickup layer of a second curable compound. The matrix is brought (230) in contact with the substrate surface and the first curable compound and the second curable compound are cured (232). The matrix surface is separated (234) from the substrate surface, leaving the pickup layer and the first curable compound on the substrate surface. The pickup layer and the first curable compound are thus transferred (240) together from the matrix surface onto a substrate surface of a substrate sheet. The first curable compound forms printed product micro features at the pickup layer covering the substrate surface.

20 Claims, 5 Drawing Sheets

(51) Int. Cl.
*B41F 9/00* (2006.01)
*B41M 1/00* (2006.01)
*G02B 3/00* (2006.01)
*G03F 7/00* (2006.01)
*B29C 65/00* (2006.01)
*B41M 1/10* (2006.01)

(52) U.S. Cl.
CPC ............. *B41M 1/10* (2013.01); *G02B 3/0031* (2013.01); *G03F 7/0002* (2013.01); *B32B 2305/72* (2013.01); *Y10T 156/17* (2015.01)

(56) References Cited

U.S. PATENT DOCUMENTS

2010/0187806 A1* 7/2010 Kaule .................. B41F 19/062
283/91
2011/0122499 A1* 5/2011 Commander .......... B41M 3/148
359/626

FOREIGN PATENT DOCUMENTS

| EP | 2 418 169 A2 | 2/2012 |
| JP | 6-24198 A | 2/1994 |
| WO | WO 2011/102800 A1 | 8/2011 |

* cited by examiner

METHOD FOR MANUFACTURING OF PRINTED PRODUCT MICRO FEATURES AND ARRANGEMENT FOR CONTINUOUS PRODUCTION OF SUCH A PRODUCT

TECHNICAL FIELD

The present invention relates in general to manufacturing of printed products, and in particular to a manufacturing method and an arrangement for producing printed products having printed product micro features arranged on a surface of a substrate sheet.

BACKGROUND

Optical arrangements giving rise to a synthetic three-dimensional image or an image that changes its appearance at different angles have been used in many applications. Besides purely esthetical uses, such arrangements have been used e.g. as security labels on bank-notes or other valuable documents, identification documents etc. or as brand protection. The synthetic three-dimensional images have also been used for providing better geometrical understanding of complex shapes in e.g. two-dimensional information documents.

Synthetic image devices are based on the interaction between an array of focusing elements and micro image portions. In some prior art "synthetic images" are also referred to as "integral images" or "moiré images", since the experienced image is composed of a number of parts interpreted together as an integral unit. The relative geometrical relation gives rise to different optical effects, from different levels of 3D to images that move or change its appearance e.g. dependent on the viewing angle. The focusing elements and the micro image portions are typically provided by printing on an essentially transparent polymer film.

One approach for manufacturing a synthetic image device is disclosed in the published International patent application WO 2011/102800 A1. Here a roll-to-roll process is achieved by the interaction of a matrix roll with a substrate. The matrix roll comprises recesses that are filled with a curable compound. The curable compound is transferred onto the substrate during a rolling contact between the matrix roll and the substrate. Typically, in order to facilitate the adhesion of the curable compound to the substrate, the surface of the substrate is pre-treated, e.g. provided with a surface layer. A good adherence between that surface layer and the curable compound in the matrix roll assists in removing the curable compound from the recesses when the rolling contact ends.

An image object in many applications of an optical arrangement that provides a synthetic integral can be coloured to obtain a black and white image, a greyscale image or a coloured image, or simply to provide proper optical properties. This colouring may typically be obtained by filling the recesses in the matrix roll with ink. This operation is a challenge, in particular in large-scale production using for example the above mentioned roll-to-roll arrangement, since the embossed cavities, ranging from µm-sized cavities to cm-sized cavities, should all be equally filled without leaving residual ink on intermediate surfaces.

When the ink is transferred to the substrate sheet, the ink may be spread outside the area defined by the recesses. This is particularly cumbersome if the substrate is provided with a surface layer for improving the adhesion properties. The contact between the substrate and the matrix roll is typically quite intense, at least at a micro level, and the contact force causes the surface layer to shear between the substrate and the matrix roll. This increases the risk for dragging ink out along from the recesses.

One way to mitigate such effects is to pre-cure the ink before it comes into contact with the surface layer of the substrate. The larger the printing speed is, the higher level of pre-curing is needed to counteract any shearing action of the surface layer. However, pre-curing of the ink within the recesses makes it in general more difficult to release the ink from the recesses and the risk that the ink becomes stuck in the matrix recesses thereby increases. These releasing problems also typically increase with increasing printing speed. If the ink is cured too much before the contact with the surface layer is established, any cross-linking between the surface layer and the ink will also be reduced, reducing the adhering effect of the surface layer.

In other words, in prior art manufacturing approaches there might be ink-spreading problems when they are used in high-speed manufacturing.

SUMMARY

One object of the invention is to facilitate high-speed printing of high accuracy product micro features on a surface of a substrate sheet. The above object is achieved by a method for manufacturing and an arrangement according to the enclosed independent claims. Preferred embodiments are defined by the dependent claims. In general words, in a first aspect, a method for manufacturing a printed product comprises providing of a matrix comprising a matrix surface having a plurality of recesses. A first curable compound is applied to the matrix surface and the recesses so as to fill the recesses with the first curable compound. The matrix surface and the recesses filled with the first curable compound are covered by a pickup layer of a second curable compound. The matrix is brought in contact with the substrate surface and the first curable compound and the second curable compound are cured, at least partly. The matrix surface is separated from the substrate surface, leaving the pickup layer and the first curable compound on the substrate surface. The pickup layer and the first curable compound filling the recesses are transferred together from the matrix surface onto a substrate surface of a substrate sheet. The first curable compound thus forms printed product micro features at the pickup layer covering the substrate surface.

In a second aspect, an arrangement for continuous production of a printed product comprises a matrix roll, a first applicator, a second applicator, a drive unit, substrate guides and curing means. The matrix roll has a circumferential surface with recesses. The first applicator is arranged for application of a first curable compound onto the matrix roll so as to fill the recesses with the first curable compound. The second applicator, which is separate from the first applicator, is arranged for covering the circumferential surface and the recesses filled with the first curable compound by a pickup layer of a second curable compound. The drive unit is arranged for rotating the matrix roll in a rotational direction. The substrate guides are arranged for bringing a substrate sheet in contact with the matrix roll in a contact section. The contact section is situated, in the rotational direction, after the second applicator. The pickup layer and the first curable compound are transferred together from the circumferential surface and left on the substrate surface. The first curable compound forms printed product micro features at the pickup layer covering the substrate surface. The curing means are arranged for curing the first curable compound and the second curable compound. The curing means is arranged to perform the curing at least to a part in the contact section.

One advantage with the above presented technology is that it enables high-speed printing with reduced risk for spreading ink out from the recesses. Other general advantages and advantages of preferred embodiments are further discussed in connection with the detailed description.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the drawings, the same reference numbers are used for similar or corresponding elements.

A product manufactured according to the present teachings comprises a body that in the product, or in an intermediate product, constitutes a substrate sheet with a limited thickness in relation to the extension in orthogonal directions thereof. The product has printed product micro features arranged on, or in, one or both principal surfaces of the substrate sheet. By way of example, one embodiment of said product may comprise primary product micro features on a first side of a substrate sheet and secondary product micro features on the opposed side of the substrate sheet. The primary product micro features are typically locationally associated with the secondary product micro features. Other embodiments of said product may comprise three or more sets of product micro features. In its most basic form the product comprises a substrate sheet with product micro features printed on only one surface thereof.

The product micro features can be used for different purposes, for example as structural and/or functional elements in a synthetic image device, as described above, or in other devices such as optical devices, electronic devices, micro fluidic devices, display devices, electrochemical devices, electrochromic devices, bioassay devices, etc or simply as printed ink in printed matter. In most of these applications the product micro features often have to be provided with high resolution and high dimensional tolerances since the functionality of the product is coupled to the dimensions and/or distribution of the product micro features. Often the product micro features also have to be small to obtain the desired effect.

Figure 1:
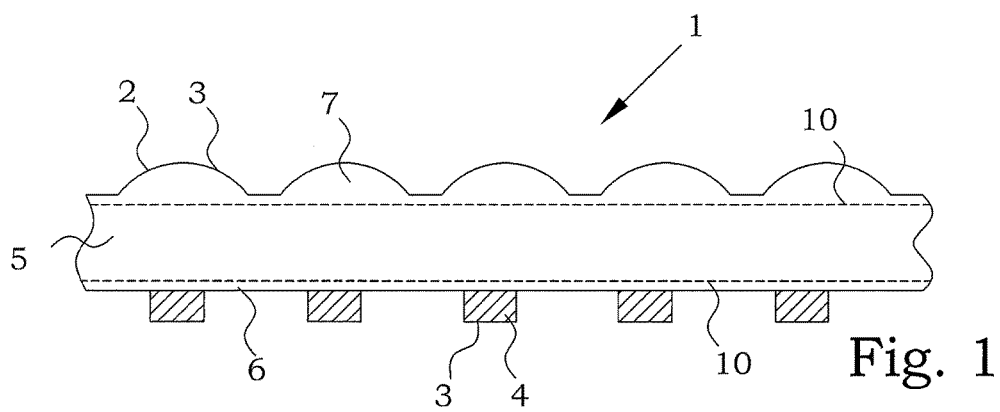
FIG. 1 is a schematic illustration of a printed product.

For illustrative purposes FIG. 1 shows a product 1 manufactured in accordance with one embodiment of the present teaching comprising an array of micro lenses 2 and an associated array of image objects 4 respectively arranged on opposite sides of a transparent substrate sheet 5. The aspects of the present disclosure are mainly described in terms of manufacturing of such a product arrangement. However, the present teachings are not limited to only this type of product but are applicable to various kinds of products having printed product micro features. In such a particular embodiment, the image objects 4 are printed on one or more pickup layers 6 (one such layer is shown, indicated by a first dotted line) arranged on the substrate sheet 5, without pre-structuring the substrate sheet 5. The micro lenses 2 may have been formed by embossing in the substrate sheet or by a cast cure process in a separate layer 7 (indicated by a second dotted line) on the substrate sheet 5. Although embodiments of the invention are exemplified with micro lenses it should be appreciated that other elements capable of focusing at a section of, and/or restricting the view of, an associated image object can be used to obtain an integral representation. Examples of other such focusing elements, besides micro lenses, are micro mirrors, apertures, lenticular mirrors and lenticular lenses. The image objects 4 are thus in this present embodiment to be considered as printed product micro features 3 at a pickup layer 6 covering the substrate surface 10. In most embodiment described below, spherical micro lenses are used as demonstration examples.

Also the micro lenses 2 can be manufactured in a similar manner, and in such a view, the micro lenses 2 are to be considered as printed product micro features 3 at a pickup layer covering the substrate surface 10.

In the present disclosure, the term "matrix" is used to denote a body having a surface presenting a pattern of recesses or holes. The surface between these recesses is essentially flat or is following a smooth general shape, e.g. a cylinder shape. The term "matrix roll" is analogously interpreted as a roll having an outer or circumferential surface exhibiting a pattern of recesses or holes. The surface between these recesses follows a smooth general cylinder shape. The pattern of recesses corresponds to the structures that are intended to be printed onto a substrate.

In FIGS. 2A-D, some of the basic ideas of the present disclosure are illustrated schematically. I FIG. 2A, a first applicator 15 is arranged to interact with a matrix roll 20. The matrix roll 20 has a circumferential surface 24 with recesses 22. The first applicator 20 is arranged for application of a first curable compound 12 onto the matrix roll 20 so as to fill the recesses 22 with the first curable compound 12. Excess volumes of first curable compound 12 may in some embodiments appear e.g. on the circumferential surface, but may easily be removed, as discussed more in detail further below. The first curable compound 12 is provided from a first source 16 onto an application roll 14 of the first applicator 15. The matrix roll 20 rotates in a rotational direction 26 and the application roll 14 is arranged in rolling contact with the circumferential surface 24 of the matrix roll 20 and rotates therefore in an opposite direction. The interaction between the first applicator 15 and the matrix roll 20 results in a transfer of the first curable compound 12 into the recesses 22. In other words, the recesses are filled with fillings 28 of the first curable compound 12 when leaving the first applicator 15. In alternative embodiments, the first applicator 15 can be composed of other parts, e.g. different kinds of spray arrangements, pouring conducts, scraping edges, slot dies etc.

The first curable compound 12 is depending on the actual application pigmented or not. Such pigmented curable compound is often referred to as "ink".

Figure 2A:
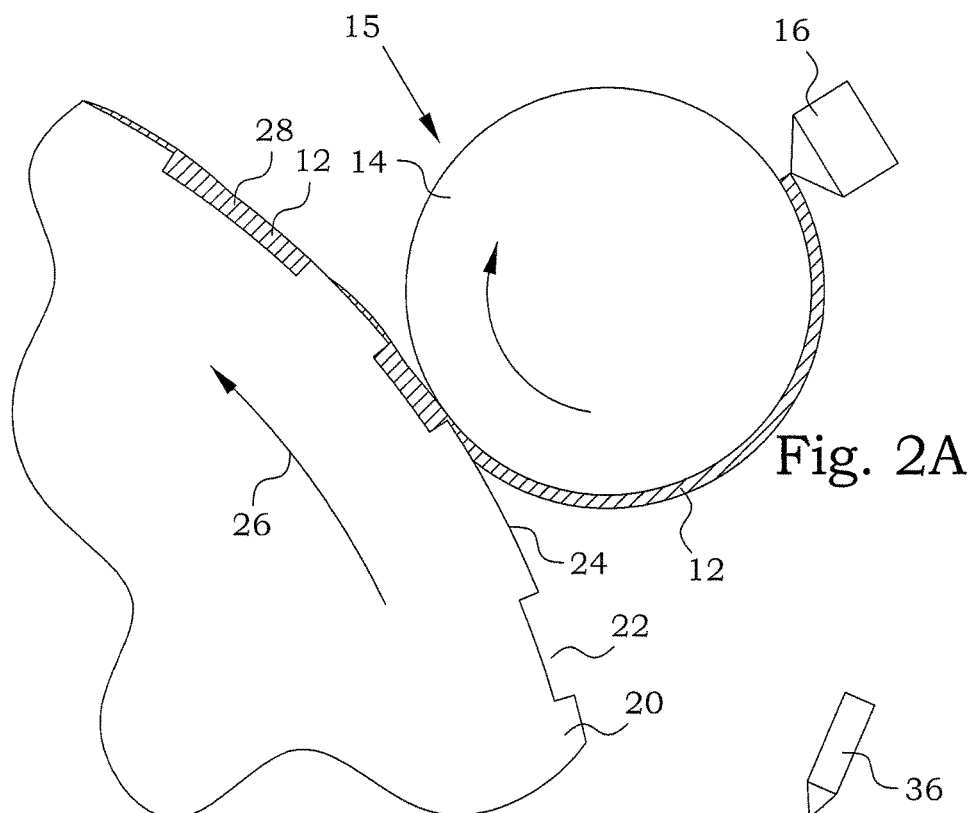
FIGS. 2A-D are schematic drawings of printing situations of an embodiment of a printing method.
Figure 2B:
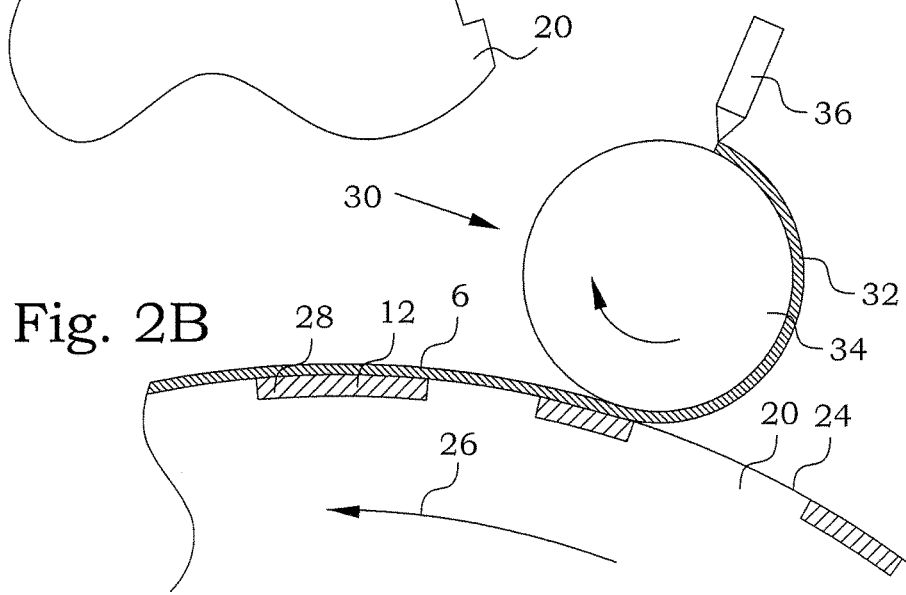

In FIG. 2B a subsequent part, with reference to the rotational direction 26, of the matrix roll 20 is illustrated. A second applicator 30 is arranged to interact with the matrix roll 20. The second applicator 30 comprises in this particular embodiment an application roll 34 and a second source 36 for a second curable compound 32. The application roll 34 is in analogy with the application roll 14 (FIG. 2A) arranged in rolling contact with the circumferential surface 24 of the matrix roll 20 and rotates therefore also in an opposite direction. The interaction between the second applicator 30 and the matrix roll 20 results in a transfer of a layer, in the present disclosure denoted a pickup layer 6, of the second curable compound 32 onto the circumferential surface 24 of the matrix roll 20 and covering the fillings 28. In other words, the circumferential surface 24 of the matrix roll 20 and the fillings 28 are covered with a pickup layer 6 when leaving the second applicator 30. In alternative embodiments, the second applicator 30 can be composed of other parts, e.g. different kinds of spray arrangements, pouring conducts, scraping edges, slot dies etc.

The interaction between the matrix roll 20 and the second applicator 30 is quite gentle, in order to leave a continuous pickup layer 6. This has the advantage that the shearing effects between the second curable compound 32 provided by the second applicator 30 and the first curable compound 12 of the fillings 28 becomes small. The risk for spreading the fillings 28 outside the recesses 22 is thereby very low.

Figure 2C:
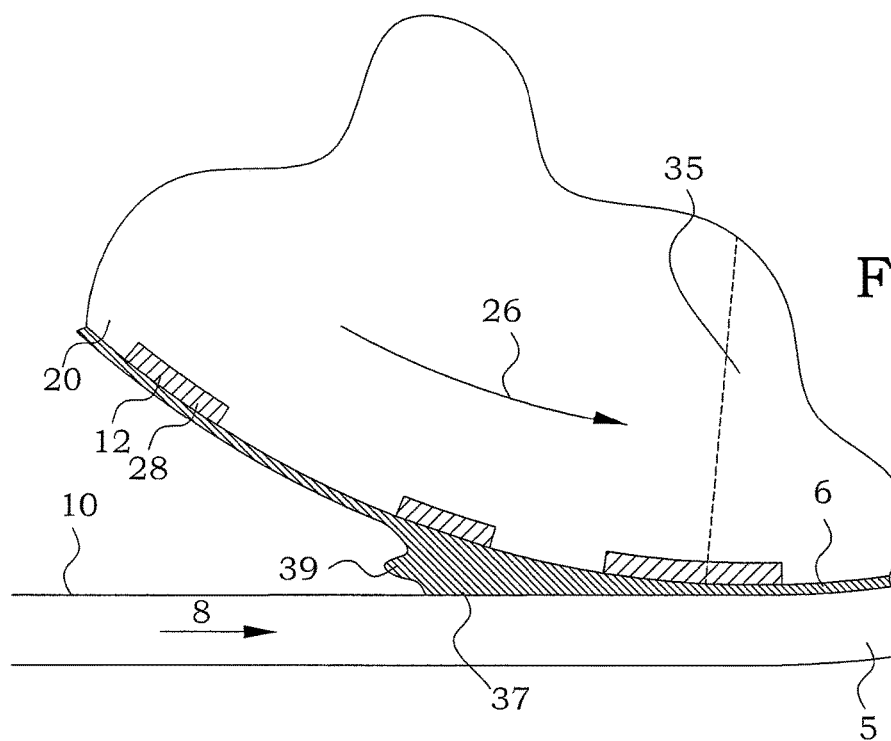

In FIG. 2C, a further subsequent part, with reference to the rotational direction 26, of the matrix roll 20 is illustrated. Here, a substrate 5 is brought into contact with the matrix roll 20, or rather the pickup layer 6 covering the circumferential surface 24 of the matrix roll 20. The substrate is fed in a feeding direction 8 at a speed substantially corresponding to the rotational speed of the circumferential surface 24 of the matrix roll 20. A substrate surface 10 comes into interaction with the pickup layer 6. This process is, at contrary to the application by the second applicator 30 (FIG. 2B), rather intense, at least at a micro level, and high shearing forces are present. A front 39 of material from the pickup layer 6 builds up in front of the intended contacting point. However, these violent forces are concentrated in the outer part 37 of the pickup layer. The material of the pickup layer close to the fillings 28 is basically more or less uninfluenced. The risk for spreading the fillings 28 outside the recesses 22 is thereby still very low. The pickup layer 6 thereby acts as a shear force protection for the first curable compound 12 in the fillings 28. At the same time, the pickup layer 6 reduces the needs for pre-treating the substrate surface 10. In a contact section 35 between the matrix roll 20 and the substrate 5, a pickup layer 6 provided between the fillings 28 and the substrate 5 is created.

Since the interaction zone between the matrix roll 20 and the substrate 5 is distanced from the interface between the pickup layer 6 and the fillings 28, the integrity of the fillings 28 becomes relatively insensitive to e.g. printing speed. Furthermore, the need for pre-curing the fillings 28 is reduced, which also facilitates a subsequent removal of the fillings 28 from the recesses 22.

The time aspect is also of importance in some embodiments. For certain combinations of first and second curable compounds, the adhesion between the fillings 28 and the pickup layer 6 improves with time. The time during which the fillings 28 and the pickup layer 6 are rotated together before entering into the contact section 35 thereby typically improves the adhesion. However, at too long contact periods before curing or at certain combination of materials, there might be a risk for that the curable compounds may dissolve more deeply into each other.

Figure 2D:
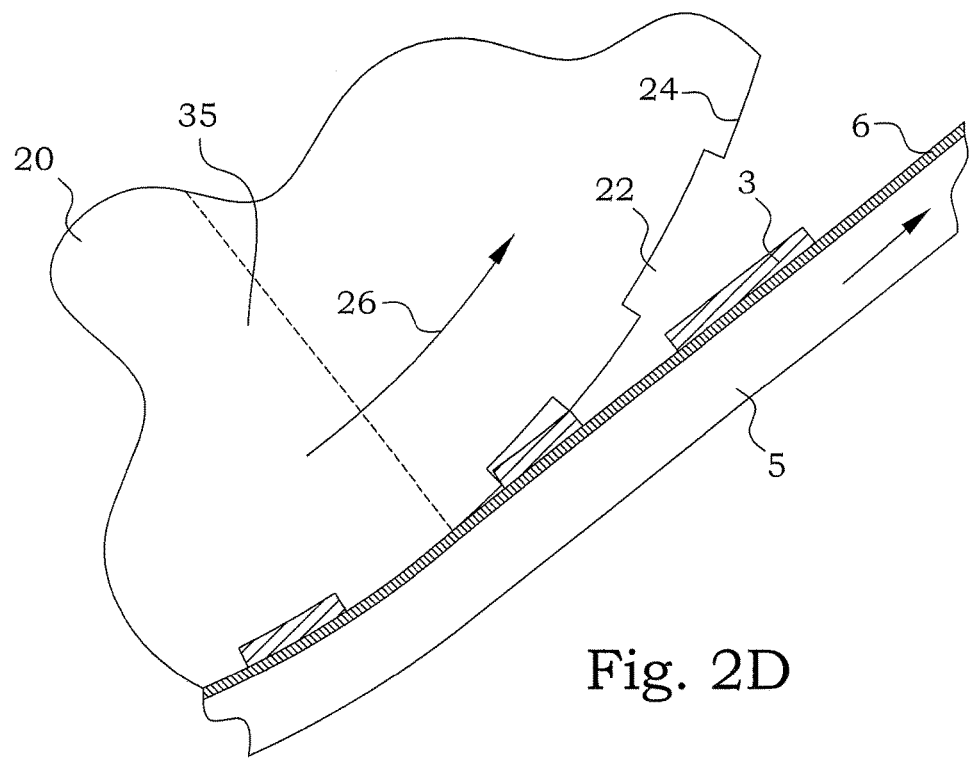

In FIG. 2D, a further subsequent part, with reference to the rotational direction 26, of the matrix roll 20 is illustrated. The fillings 28 and the pickup layer 6 are cured, at least partly, in the contact section 35, creating a solid-like integral coating on the substrate surface 10. At these conditions, the substrate 5 is separated from the matrix roll 20, i.e. the contact section ends. By adapting e.g. the viscosity, adhesion properties, curing etc. of the first and second curable compounds 12, 32, the pickup layer 6 and the fillings 28 will follow the substrate 5, leaving unfilled recesses in the matrix roll 20. The first curable compound 12 previous constituting the fillings 28 thus forms printed product micro features 3 at the pickup layer 6 covering the substrate surface 10.

Since the interaction zone between the matrix roll 20 and the substrate 5 is distanced from the interface between the pickup layer 6 and the fillings 28, the integrity of the fillings 28 becomes relatively insensitive to e.g. printing speed. Furthermore, the need for pre-curing the fillings 28 is reduced, which also facilitates a subsequent removal of the fillings 28 from the recesses 22.

Note that the FIGS. 2A-D are intended to show the principles in a very schematic manner and there may in different real embodiments be various additional steps, devices or alternative designs.

Figure 3:
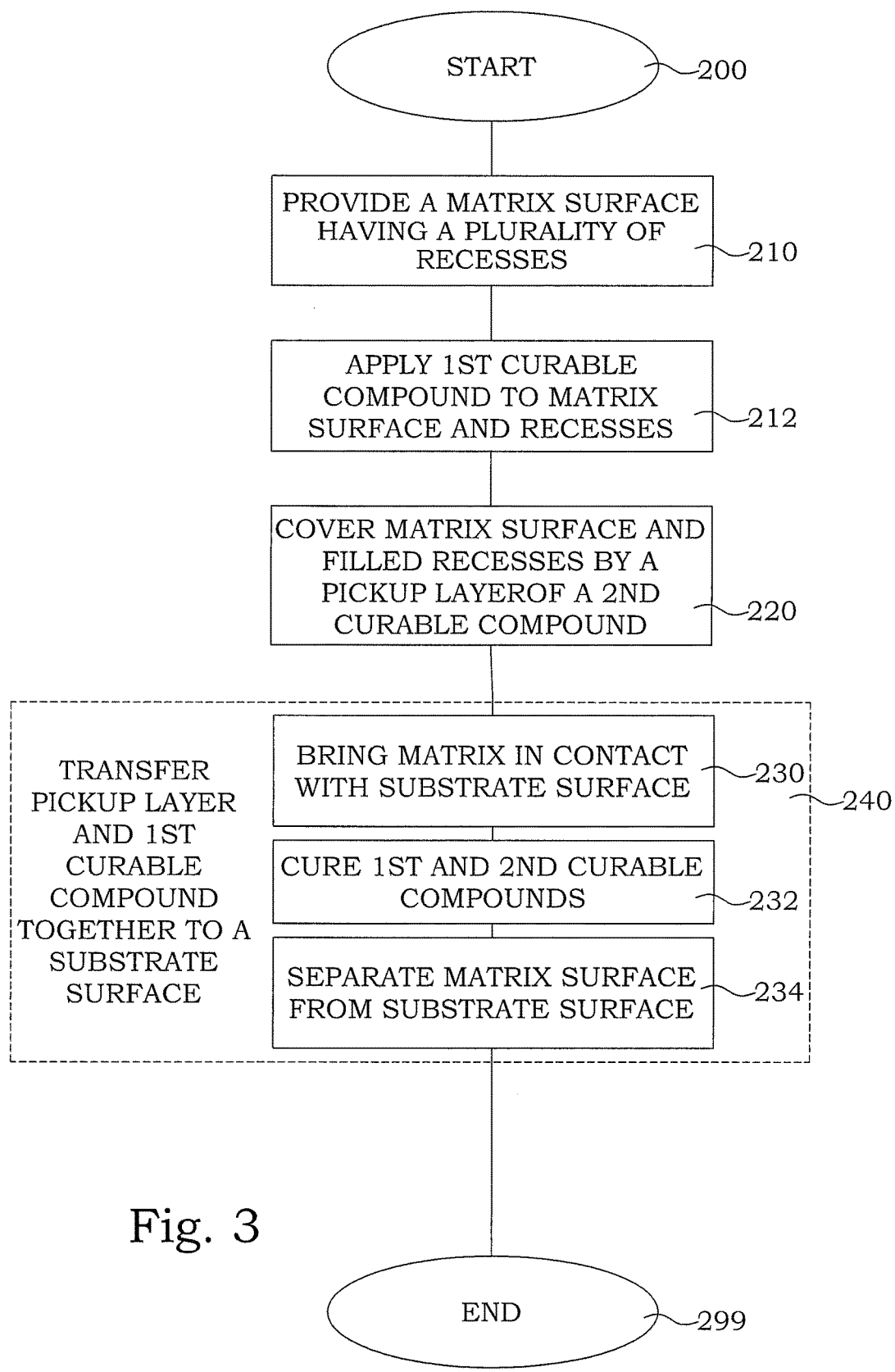
FIG. 3 is a flow diagram of steps of an embodiment of a printing method.

FIG. 3 illustrates a flow diagram of steps of an embodiment of a manufacturing method. The method for manufacturing a printed product starts in step 200. In step 210, a matrix comprising a matrix surface having a plurality of recesses is provided. A first curable compound is in step 212 applied to the matrix surface and the recesses so as to fill the recesses with the first curable compound. In step 220, the matrix surface and the recesses filled with the first curable compound are covered by a pickup layer of a second curable compound. The matrix is in step 230 brought in contact with the substrate surface, and in step 232, said first curable compound and said second curable compound are cured, at least partly. In step 234 the matrix surface is subsequently separated from the substrate surface, leaving the pickup layer and the first curable compound on the substrate surface. The pickup layer and the first curable compound filling the recesses are thus transferred together, indicated as a common step 240, from the matrix surface onto a substrate surface of a substrate sheet. The first curable compound thus forms printed product micro features at the pickup layer covering the substrate surface. The process ends in step 299.

Selection of curable compounds is typically dependent on a lot of factors, both manufacturing related factors and requested final product properties. In one embodiment, the first curable compound is the same as the second curable compound. In another embodiment, the first curable compound is different from the second curable compound. In one embodiment, the second curable compound forms the same material as in the substrate when being cured.

The printing process is improved by the provision of the pickup layer prior to printing. During transfer of the first curable compound the adhesion between the first curable compound and the pickup layer has to overcome the forces holding the curable compound in the recesses. The adhesion between the curable compound and the substrate sheet 5 during the transferring is improved by the deposition of the pickup layer. The pickup layer functions as an adhesive layer in the step of transferring. The pickup layer is of increased importance when pre-curing of the first curable compound before transferring is used since this typically reduces the inherent adhesive properties of the curable compound, or at least the wetting properties of the curable compound. These adhesive, or wetting properties, are improved by applying the appropriate pickup layer before printing.

When printing with recesses filled with a curable compound without any pickup layer, as in prior art, there is always a risk to encapsulate air pockets. Typically, such air pockets often appear close to the edge of a recess, in particular if the filling of the recess is not absolutely perfect. When the curable compound is cured, the oxygen in the air pocket will typically prohibit or at least slow down the curing process, which then results in an air pocket with sticky, non-cured surfaces. Such unsatisfactory curing reduces the adhesion to the substrate and may result in that the curable compound or part thereof remains in the recess after the separation from the substrate.

By application of the pickup layer, any remaining geometries deviating from the main matrix surface, e.g. not completely filled recesses, are eventually filled up. Since the pickup layer is allowed to spread also over the surfaces between the recesses, the complete filling of any possible unfilled portions of the recesses is easy to achieve.

By then performing the actual printing process between two essentially flat and continuous layers, the risk for encapsulating air pockets is significantly reduced. If any air pockets anyway are provided, these air pockets do at least not influence the release of the curable compound from the recesses.

The first curable compound is preferably at least partly cured at some stage of the processing of the product, e.g. before the contacting with the substrates. The first curable compound can be of a wide range of materials and hence curing may be accomplished by different mechanisms. Normally the term curing is associated with polymerisation of polymer materials initiated by irradiation, such as irradiation with ultraviolet (UV) light, and/or heating. Infrared irradiation, electron beam irradiation and the addition of chemical additives are other examples of means for curing. The first curable compound may comprise non-curable constituents as well. For the purpose of this application the term curing also includes drying. As in many conventional printing techniques different kind of inks may be used for the curable compound. Preferably inks with dyes are used. Pigments may cause problems when printing small product micro features since the size of pigments particles usually is too large, which may adversely affect the resolution and colour density of the printed product micro features.

In many applications, however, not all, there is a risk for that the amount of applied curable compound is larger than the volume of the recesses. Excessive curable compounds may therefore be present above the recesses as well as on the portions of the matrix separating the recesses. One way to at least partially solve that problem is to control the amount of curable compound that is provided to the surface of the matrix. A pattern of recesses with a small open area basically need less volume of the curable compound to be filled than a pattern of recesses with a large open area. Examples of such arrangements are discussed further below.

In order to avoid printing of the first curable compound on intermediate surfaces, i.e. between and outside the printed product micro features, on the substrate sheet any excess of the first curable compound in areas of the matrix surface of the matrix outside the recesses is removed such that the first curable compound of the product micro features eventually transferred to the substrate sheet substantially originates from the recesses. By way of example, a squeegee, a clean rubber roll or the like can be used to wipe off any excessive curable compound from the matrix surface. Excessive first curable compound can also be removed by polishing. Different means for removal of excessive first curable compound can also be combined. In other words, under such conditions, it is preferable to introduce a process step, in which excessive first curable compound is removed from matrix surface outside the recesses before the covering by a pickup layer.

Ideally the first curable compound initially has a low viscosity in order to enable the filling of small recesses of the matrix. This low viscosity is in a preferred embodiment typically between 100 and 600 mPas. However, if removing of excessive first curable compound is necessary, using e.g. a squeegee or a polishing means, the first curable compound may be removed from the recesses, in particular recesses having a comparatively large open surface as compared to the depth thereof, due to capillary forces acting on the low-viscosity curable compound. Thus a higher viscosity of the first curable compound is desired while removing excessive first curable compound. These contradictory requirements regarding the viscosity of the curable compound may be overcome when having equally sized recesses since the viscosity can be adapted for the size of the recesses, but the problem is augmented when using recesses having sizes varying over a wide range, and in particular when the matrix comprises recesses having a large open surface, i.e. a large width or diameter and a comparatively shallow depth. Therefore a preferred embodiment of the manufacturing method comprises the step of increasing the viscosity of the first curable compound, e.g. by pre-curing, after filling of the recesses, i.e. the viscosity is lower during filling than e.g. during removal of excess first curable compound. If removal of excess first curable compound is performed, preferably the viscosity of the first curable compound is increased before a final removal such that the first curable compound behaves like a paste that is not significantly affected by capillary forces. An increase in the viscosity of the first curable compound applied to the matrix can be obtained by at least partly curing the first curable compound. The viscosity can also be controlled by other means such as by reducing the temperature of the first curable compound.

The removal of excess amount of first curable compound can in particular embodiments be performed in two steps. First, a reduction polishing is performed on the first curable compound as deposited. The purposes of this reduction polishing are on one hand to remove larger accumulations of first curable compound from areas between the recesses and to use this material to fill in unfilled or not completely filled recesses. The reduction polishing thereby operates to even out the material over the surface of the matrix. On the other hand, the reduction polishing should also, as the name indicates, be material removing, i.e. actually reducing the amount of first curable compound from areas between the recesses. Since the first curable compound upon application typically has a relatively low viscosity, the polishing tools, e.g. wiping towels, armed paper cloth or micro fibre cloth, should preferably be capillary active for picking up excess first curable compounds. The amount of first curable compound still existing at the matrix surface between the recesses should preferably be in the form of a thin relatively homogeneous layer rather than in stripes with larger thicknesses surrounded with completely clean surface segments. It is also possible to polish away also thick stripes, however, this requires more carefully adapted conditions, typically including higher polishing pressures.

The arrangements for reduction polishing can be designed for different aspects. If a relatively hard and small polishing roll is used, the contact with the matrix surface is fast and a fast assimilation of the excess material is necessary. Micro fibres are then a suitable choice. If a softer and larger polishing roll is used, the distributing effect between excess areas and unfilled recess volumes instead becomes larger.

The behaviour of the polishing tool, and in particular the transport properties within the material of the tool, can be modified in different ways. One possibility is to wet for example the polishing paper or microfibres with a suitable solvent. The solvent may wet the tool and/or partly dissolve surface parts of the tool or the first curable compound for improving the capillary transport properties.

The reduction polishing can then be followed by a partial curing of the first curable compound. The viscosity is increased and capillary forces are therefore no longer equally important. A dry polishing step can then follow, which removes the excess material by a shearing action. This polishing may therefore also be referred to as shearing polishing. The remaining first curable compound at the matrix surface between the recesses is thus removed in more as flakes. The capillary properties of the polishing cloths are therefore not of equal importance for the shearing polishing step. If thicker stripes would be present during the partial curing, there may be a risk that part of the first curable compound at the matrix surface between the recesses still will be relatively viscous, which makes the final shearing polishing difficult to perform. The shearing polishing does not redistribute any first curable compound between different parts of the matrix.

In other words, one embodiment of a manufacturing method comprises the further step of pre-curing the first curable compound in the recesses before the step of covering the matrix surface and the recesses filled with the first curable compound by a pickup layer. Moreover, the pre-curing is, at least to a part, performed before the removing of excessive first curable compound, if any.

As indicated above, the step of removal of the excessive first curable compound on intermediate surfaces may be influenced by the properties of the first curable compound. The step of removal can be accomplished using polishing means that comprises pores or cavities, such as a fibre cloth, collecting the removed excessive first curable compound. When the viscosity of the first curable compound is low enough to fill small recesses, it is possible that during polishing capillary forces withdraw part of the first curable compound from the recesses (this is known as "dimpling")—which is undesirable. An increase of the viscosity before polishing in accordance with the ideas above enables accurate removal since the withdrawal due to capillary forces is eliminated. Moreover, the first curable compound is toughened and obtains an increased stiffness after the pre-curing, whereby the first curable compound is better able to withstand the forces exerted by the polishing means and thus dimpling can be minimised. The removal of excessive first curable compound using a squeegee may also be influenced by capillary forces dragging first curable compound out from the recesses and onto the intermediate surfaces and may be avoided by taking actions to obtain a suitably high viscosity.

In one embodiment of the manufacturing method first curable compound is repeatedly applied to the surface of the matrix, optionally with intermediate removal of excessive first curable compound, whereby any lack of filling of the recesses from previous steps of applying and removing can be remedied. For example, whereas comparatively small recesses normally are completely filled at once, as recesses are comparatively large they may be incompletely filled by only one iteration of the steps of applying and removing first curable compound. One object of this iteration is to improve perceived contrast in an image represented by the product micro features and intermediate surfaces.

A similar situation occurs also at the process step of applying the pickup layer. Even if the application of the pickup layer is gentle compared to the later actual printing process, there has to be some kind of minor mechanical interaction during the application of the pickup layer. It is therefore for analogue reasons also of benefit for the application of the pickup layer to have a first curable compound in the recesses that has a somewhat higher viscosity than when the first curable compound was applied to the recesses. In one preferred embodiment, a manufacturing process thus comprises the further step of pre-curing the first curable compound in the recesses before the covering of the matrix surface and the recesses filled with the first curable compound by a pickup layer is performed.

However, a partially uncured first curable compound will typically have a higher adhesion to the pickup layer. Therefore, in most cases a fully cured first curable compound is not requested. In other words, in one embodiment, by leaving the curable compound partly uncured, the adhesion to the pickup layer will be improved in some cases.

The duration of the contact between the first curable compound and the pickup layer is also important. When performing the application of the pickup layer, the wet pickup layer will to some extent start to disintegrate or dissolve the surface of the partially cured first curable compound in the recesses. This dissolution contributes to a higher final adhesion between the first curable compound in the recesses and the pickup layer. When the first curable compound in the recesses and the pickup layer subsequently are cured, such disintegration is again revoked, instead creating a strong bond between the two materials. A long contact time between the first curable compound in the recesses and the pickup layer before the common curing will increase the adhesion properties between the materials in the final product. Such a contact time involves at least the application of the pickup layer and the transportation of the combined layer to the contact section and also a part of the time spent in the contact section itself. This time period can be compared with the prior art contact time between the possibly surface-treated substrate and the first curable compound in the recesses, which is limited only to a part of the contact section to establish the adhesion.

The extent of curing of the first curable compound also has an effect on the ability to transfer the first curable compound in the recesses to the substrate sheet, i.e. the ability to withdraw the curable compound from the recesses. The extent of curing can be controlled before removal, but also the curable compound remaining in the recesses after removal of excessive curable compound and application of the pickup layer can be further cured prior to and/or during contact with the substrate sheet. In other words, in one embodiment of a manufacturing method, the final curing is, at least to a part, performed during the step of transferring.

A strong bond between the pickup layer and the first curable compound in the recesses opens up additional advantages. A high contrast in the produced product micro features can be achieved by using the thickness of the print, i.e. using recesses in the matrix having a large depth. A large depth, however, makes the release from the recess harder to perform. However, with the firm attachment between the pickup layer and the first curable compound, also relatively thick prints can be achieved.

If a high resolution is required in the final product micro features or if complex shapes are requested, the aspect ratio of the recesses typically increases. The amount of side walls in the matrix surface, directed in very different directions, increases and thereby the separation of the cured first curable compound from the recess becomes heavier. Also here, with the firm attachment between the pickup layer and the first curable compound, also prints emanating from high aspect ratio matrixes can be achieved.

With reference to FIG. 1, a product manufactured according to the above presented ideas may have one or more additional product micro features 3, e.g. lenses 2, provided in or on the substrate sheet 5 by embossing in the substrate sheet 5 or by applying a coating to the surface of the substrate sheet 5. Each additional product feature 3 being associated with a printed product feature 3 on the opposite side of the substrate sheet 5 may thereby form a focusing element 2 and an image object 4 pair for a synthetic image device. The product micro features 3 can be provided in any order, i.e. in the present embodiment first the lenses 2, followed by the image objects 4, or the image objects 4 followed by the lenses 2, or all product micro features 3 at the same time.

Further additional product micro features can also be provided independently or aligned with product micro features 3 with the same processes or different processes. The substrate sheet 5 may also be provided with product micro features pre-formed in or on the substrate sheet 5.

An important aspect of the product properties is the substrate sheet thickness since this at least partly determines the alignment in the thickness direction of product micro features on opposed sides of the substrate sheet. In prior art solutions with low-viscous surface treatments on the substrate, the substrate sheet thickness cannot be modified very much. However, by having a pickup layer on top of the curable compound in the matrix recesses, the situation is completely different.

During pre-treatment, the substrate sheet thickness can in one embodiment be modified by the deposition of the pickup layer comprising the second curable material in order to form an offset layer on the substrate sheet. The thickness of this offset layer can be controlled and, if necessary, varied during production.

In another embodiment, more than one pick-up layers are provided on top of each other. In such embodiments, the innermost pickup layer can be optimized for establishing a good adhesion to the curable compound in the recesses and may e.g. have a relatively high viscosity. On top of this layer, an additional pickup layer may be provided, which e.g. has a lower viscosity for improving the wetting properties against the substrate.

The pickup layer comprises a second curable material and is often referred to as a lacquer. However, the pickup layer 6 may also additionally comprise non-curable constituents.

The application of the pickup layer may include the deposition of different primers or solvents, etching etc. in order to modify the surface properties of the first curable compound to obtain improved adhesion. Surface modification can also be applied on the outer surface of the pickup layer in order to modify the adhesion properties relative to the substrate. An increase in adhesion is typically accomplished by an increase of the surface energy of the pickup layer.

The pickup layer may also in addition be pre-cured to some extent prior to contact with the substrate, and/or cured after being withdrawn from the matrix.

In optical applications the pickup layer is preferably transparent or partly transparent. Filling and selective removal of first curable compound can be assisted by manipulation of the surface properties of the matrix, i.e. by having comparatively hydrophilic recesses and comparatively hydrophobic intermediate surfaces between the recesses. This can be accomplished e.g. by having a Ni matrix with cavities filled with silicone, etching recesses so as to obtain a surface texture in the recesses that provides a more hydrophilic surface than the intermediate native surfaces, or coating of intermediate surfaces with hydrophobic polytetrafluoroethylene or the like.

Figure 4:
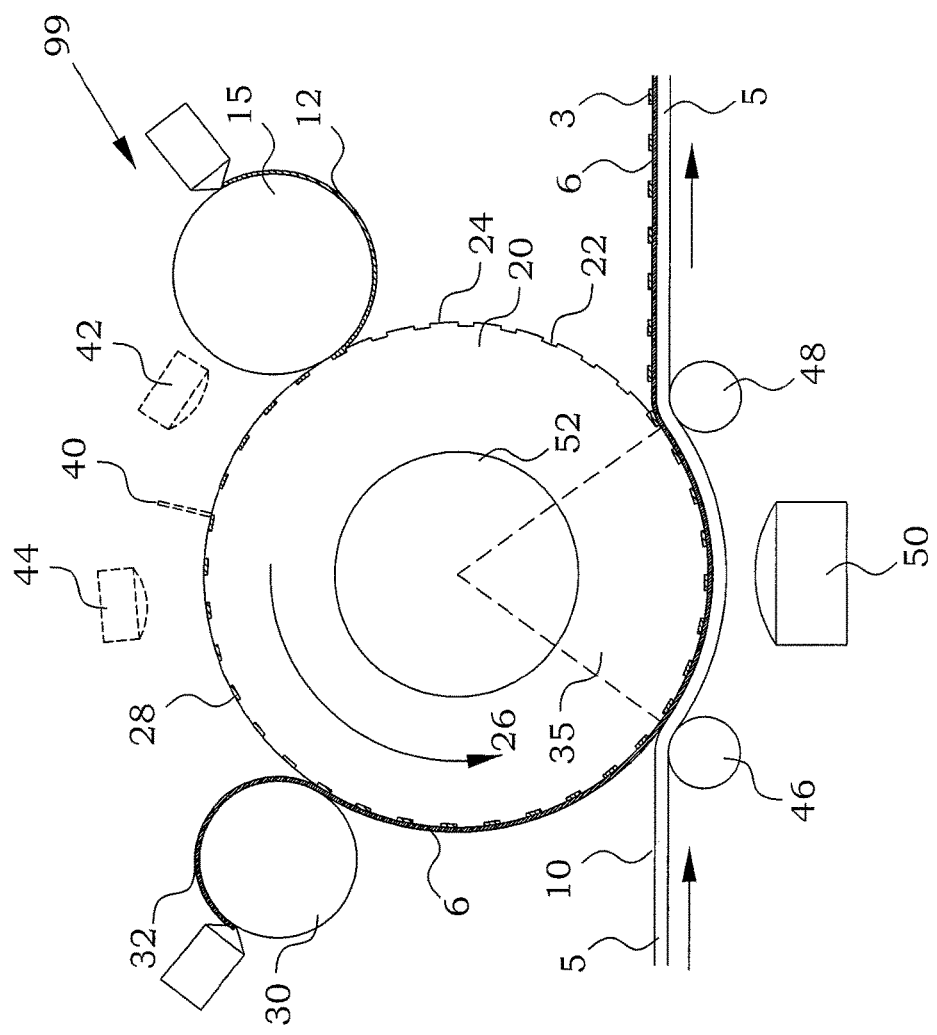
FIG. 4 is a schematic drawing of an embodiment of a printing arrangement.

FIG. 4 illustrates schematically an embodiment of an arrangement 99 for continuous production of a printed product. A matrix roll 20 has a circumferential surface 24 with recesses 22. A drive unit 52 arranged for rotating said matrix roll 20 in a rotational direction 26. A first applicator 15 is arranged for application of a first curable compound onto the matrix roll so as to fill the recesses 22 with the first curable compound. In a particular embodiment, the first applicator 15 comprises an anilox roll, whereby a well determined amount of the first curable compound can be applied. The first curable compound is in this particular embodiment then transferred to the matrix roll 20 via a cliché cylinder of rubber.

The amount of the first curable compound is in one embodiment easily controlled by controlling a so-called K-factor, i.e. the relative velocity ratio between the contacting parts of the anilox roll and the cliché cylinder. A lower speed of the circumferential surface of the anilox roll, i.e. a K-factor less than 1, gives a lower amount of the first curable compound on the cliché cylinder, which in turn means a smaller amount of the first curable compound provided to the matrix roll per time unit. Similarly, a circumferential speed of the anilox roll surface that is higher than the speed of the cliché cylinder surface gives a higher amount of the first curable compound on the cliché cylinder. Thus, by controlling the relative rotational speed, the amount of the first curable compound provided to the matrix roll can be controlled, e.g. to suit the pattern in the matrix roll.

A second applicator 30, separate from the first applicator 15, is arranged for covering the circumferential surface 24 and the recesses 22 filled with the first curable compound by a pickup layer 6 of a second curable compound.

Also the relative velocities of the cliché cylinder and the matrix roll may be controlled in the second applicator in particular embodiments. When the cliché cylinder leaves the second curable compound onto the surface of the matrix roll, the contacting surfaces have typically essentially the same velocity. The second curable compound is pushed into any remaining parts of the recesses of the matrix roll, not filled by the first curable compound. This can be the case e.g. if the pattern of recesses is very complex with e.g. small features with high aspect ratios, or if the matrix roll comprises non-perfect joints. In the contact between the cliché cylinder and the matrix roll a front of the second curable compound is typically built up in front of the contacting point, which typically fills most dimplings or other similar unfilled cavities. However, despite such a build-up of excess material, volumes following or preceding e.g. a joint in the tool may still not be filled completely, e.g. due to shadowing effects. In other words, the geometrical form can cause the build-up of material to pass areas just behind e.g. defects or joints without reaching into every volume.

In order to improve the filling properties, the relative speed between the cliché cylinder and the matrix roll may be changed, which introduces a sliding component in the contact between surfaces of the cliché cylinder and the matrix roll. If the circumferential surface of the cliché cylinder is controlled to be faster than the surface of the matrix roll, the cliché cylinder will slide relative to the surface of the matrix roll in a direction of the rotation direction of the matrix roll, i.e. in opposite direction to the material build-up. By this relative sliding, the first curable compound can be provided to parts of the matrix surface that otherwise are difficult to reach, e.g. due to the above described shadowing.

A similar effect is achieved if the circumferential surface of the cliché cylinder is controlled to be slower than the surface of the matrix roll. The relative sliding direction will then be the opposite.

Thereby, depending on the actual pattern of the matrix roll and/or joints in the matrix roll surface, the relative speed of the between the cliché cylinder and the matrix roll may be changed to achieve a better filling of the recesses.

Substrate guides 46, 48 are arranged for bringing a substrate sheet 5 in contact with the matrix roll 20 in a contact section 35. The contact section 35 is situated, in the rotational direction 26, after the second applicator 30. The pickup layer 6 and the first curable compound are transferred together from the circumferential surface 22 and left on a surface 10 of the substrate sheet 5. Thereby the first curable compound forms printed product micro features 3 at the pickup layer 6 covering the substrate surface 10. The arrangement 99 further comprises curing means 50. The curing means 50 is arranged for curing the first curable compound and the second curable compound. The curing means 50 is arranged to perform the curing at least to a part within the contact section 35. A final curing can also be performed after the contact section 35 is left.

The first applicator 15, the second applicator 30 and the substrate guides 46, 48 are arranged around the matrix roll 20. The first applicator 15 and the second applicator 30 are illustrated as rolls, however, as discussed further above, they are not limited to this. The substrate sheet 5 is in the embodiment of FIG. 4 guided by a pressure roll 46 and a peeling roll 48. In the zone between these rolls, the substrate sheet 5 follows the surface of the matrix roll 20. In other words, the contact section 35 is in the present embodiment defined by the positions of the pressure roll 46 and the peeling roll 48. As appreciated by a person skilled in the art, the precise placement of the different components is not limited to exactly the set-up shown in FIG. 3, but can in alternative embodiments be altered.

In other words, the matrix that is designed as the mould for the product micro features is thus preferably provided on a roll and at least the transferring of the first curable compound and the pickup layer is performed in a roll-to-roll process wherein at least the printed product micro features are continuously formed on the substrate sheet that is brought into rolling contact with the matrix roll.

In operation, the substrate sheet 5 is provided and fed between the pressure roll 46 and the matrix roll 20 and then between the peeling roll 48 and the matrix roll 20, whereby the substrate sheet 5 is brought into rolling contact with the matrix roll 20 around a section of the matrix roll 20. As being described above, at a first position around the matrix roll 20 a first curable compound is applied to the matrix roll 20 whereby the recesses 22 in the circumferential surface 24 of the matrix roll 20 are at least partly filled with the first curable compound. Preferably the viscosity of the first curable compound is adapted to enable it to fill the smallest recesses. In one preferred embodiment of an arrangement 99 for continuous production of a printed product, excessive first curable compound outside the recesses 22 is removed by removal means 40 arranged at a second position around the matrix roll 20. Since the removal means 40 is not absolutely compulsory, it is illustrated by broken lines. The removal means 40 is thus arranged for removal of excessive the first curable compound from the circumferential surface 24 of said matrix roll 20 outside the recesses 22. The removal means is arranged, with respect to the rotational direction 26, before the second applicator 30.

The removal means 40 may in different particular embodiments comprise a squeegee and/or a polishing means. One example of a polishing means is a fibre cloth arranged on a roll that is arranged to contact the matrix roll surface. Two or more removal means 40 can in certain embodiments be arranged in sequence to efficiently remove excessive first curable compound, e.g. a squeegee followed by a polishing means. Thereby the amount of excessive first curable compound left on intermediate surfaces can be minimised, which improves the polishing.

In one preferred embodiment of an arrangement 99 for continuous production of a printed product, pre-curing means 42 for increasing the viscosity of the first curable compound before removal of excessive first curable compound is arranged at least in-between the applicator 15 and the removal means 40. Since the pre-curing means 42 is not absolutely compulsory, it is illustrated by broken lines. Thus, the pre-curing means 42 is arranged for pre-curing the first curable compound in the recesses. The pre-curing means 42 is arranged to perform the pre-curing at least to a part before the removing of excessive first curable compound. The pre-curing means 42 is arranged, with respect to the rotational direction 26, before the second applicator 30.

Optionally, removal means may arranged at a position between the applicator 15 and the pre-curing means 42 to permit a coarse removal of excessive first curable compound. Thereby the viscosity of the first curable compound can first be optimised for filling of the first curable compound into the recesses 22 and then optimised by at least being partly cured to permit efficient removal of excessive first curable compound without removing the first curable compound from within the recesses 22. The first curable compound is at this step not necessarily fully cured, indeed it does not have to be cured at all when viscosity is increased by other means. Additional curing may be performed at subsequent steps. Depending on the mechanism used for increasing the viscosity different curing means, such as a lamp (UV, infrared, etc.), a heat source, a cooling means or an electron beam gun, may be used. In one embodiment of the invention pre-curing means 44 may in addition be arranged in sequence with the applicator 30 at a position prior to where the matrix roll 20 is brought into rolling contact with the substrate sheet 5. At this position both the first and second curable compound can be cured, or further cured, if it has been partly cured before, but not necessarily fully cured.

Moreover, additional rolls, removal means and curing means may be arranged around the matrix roll and/or at the substrate sheet in order to accomplish the embodiments of the method as described above, for example additional applicators and removal means would need to be arranged at the matrix roll to accomplished the iteration of the steps of applying and removing.

At a third position, at the beginning of the contact section 35, the substrate sheet 5 is brought into contact with the pickup layer 6 on the matrix roll 20 covering the first curable compound in the recesses 22 by means of the pressure roll 46. The pickup layer 6 adheres to the substrate sheet 5. When the substrate sheet 5 is released from the circumferential surface 24 of the matrix roll 20 at the peeling roll 48 the first curable compound in the recesses 22 is peeled out from the recesses 22 and thereby transferred to the substrate sheet 5 to form the product micro features 3 on the pickup layer in turn on top of the substrate sheet 5.

Curing means 50 is in one embodiment arranged at a position where the matrix roll 20 is in rolling contact with the substrate sheet 5. It can be used for additional curing, or, if no curing has been made previously, a first curing, of the first curable compound in the recesses 22 and the second curable compound in the pickup layer 6 before transfer of the first curable compound from the recesses 22 to the substrate sheet 5. In other words, the curing means 50 is arranged to perform the curing at least to a part in the contact section 35.

Figure 5:
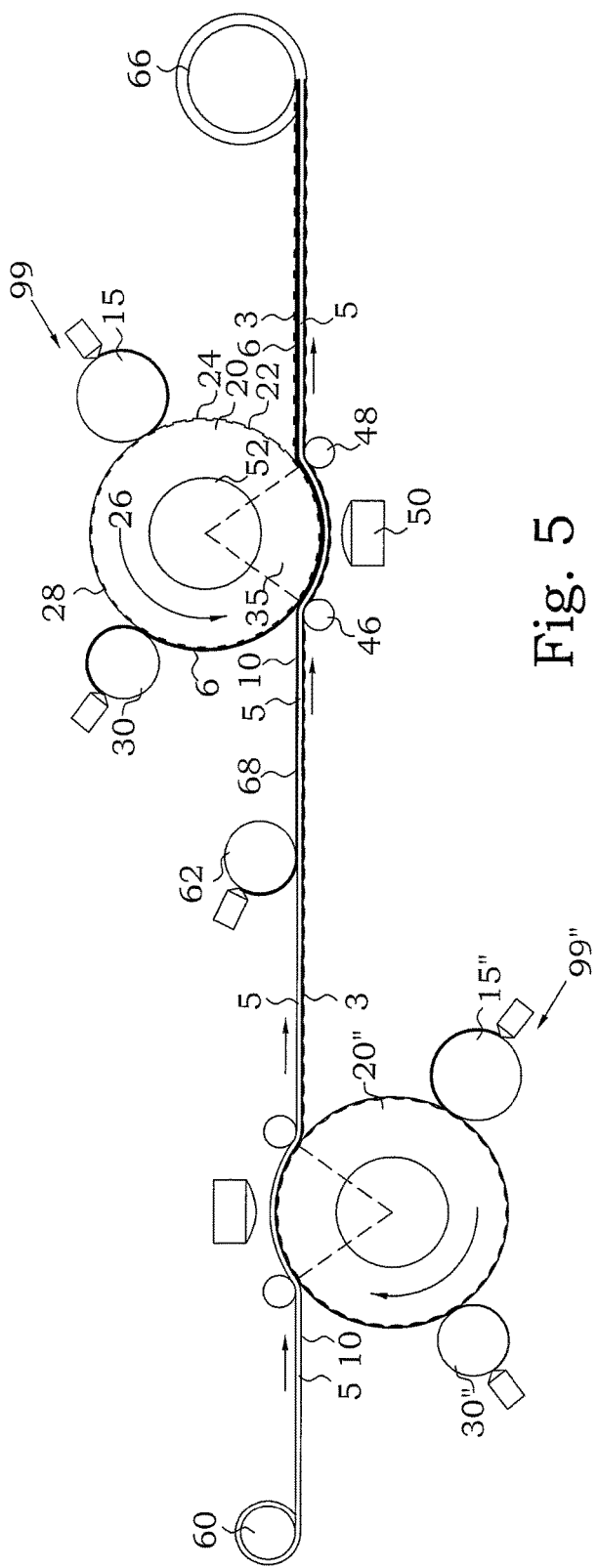
FIG. 5 is a schematic drawing of an embodiment of another printing arrangement.

In a further embodiment of an arrangement 99 for continuous production of a printed product, illustrated in FIG. 5, means 99″ for providing additional product micro features, such as e.g. lenses 2, on the substrate sheet 5 on one side of the substrate sheet or both are provided. In this particular embodiment, the means 99″ for providing additional product micro features comprises another set of printing equipment analogue to the previous described one, where recesses corresponding to lenses 2 are provided in a matrix roll 20″. A first applicator 15″ provides a first curable compound into the recesses. A second applicator 30″ provides a pickup layer on top of the lenses to be. A substrate sheet 5 is provided from a supply roll 60 and the lenses are printed onto the substrate surface 10. The means 99″ for providing additional product micro features thus forms additional product micro features, e.g. in the form of micro lenses 2 on one side of the substrate sheet 5. After provision of the other printed product micro features 3, e.g. image objects 4 on the other side of the substrate 5, the printed product is collected at a collection roll 66.

An advantage by using a pickup layer also at the provision of the spherical micro lenses 2 is that it reduces the risk of encapsulating air volumes into the product, as is the case if the first curable compound is contacted directly to the substrate surface or on a substrate surface provided with a covering wetting layer.

In alternative embodiment, the means for providing additional product micro features may comprise means based on different techniques and process types such as, different types of printing, embossing, continuous casting, surface coating, laminating, or combinations thereof. Examples of printing techniques comprise screen printing, offset printing, flexographic printing, ink-jet printing and of course printing in accordance with the method of the present invention.

In a preferred embodiment, the substrate sheet is at least in the areas that contribute to generation of a synthetic integral image transparent or translucent. Other areas may be opaque or have reduced transparency. For some optical applications the transparency may be of uttermost importance, however, for other applications, reflecting layers are instead required. The substrate sheet may thus in different applications comprise paper, films or metal, such as aluminium. Although the above illustrated embodiments are primarily illustrated with a substrate sheet constituted by a single layer, it is not limited to this. In alternative embodiments, two or more layers can be joined by techniques known in the art. The substrate sheet may in different embodiments be cast, calendared, blown, extruded and/or biaxially extruded. The substrate sheet may comprise polymeric compounds such as any one or more selected from the group comprising polythyleneterephthalate, polymetylenemetacrylate, polypropylene propafilm, polyvinylchloride, rigid pvc, cellulose, tri-acetate, acetate polystyrene, polyethylene, nylon, acrylic and polytherimide board. Papers made from wood pulp or cotton or synthetic wood free fibres or the like can also be used. The paper may be coated, calendared or machine glazed.

The matrix or matrix roll, may in one embodiment involve a printing plate. Such a printing plate is preferable fabricated using micro fabrication methods such as photolithographic techniques or e-beam direct writing, which are well known in the field of microsystems technology and microelectronics. This enables very high resolution, i.e. better than 0.5 µm. In other words, the used line width can in specific embodiments be at least down to 0.5 µm, due to the improved adhesion properties. Typical depths of the recesses can be in the order of 1-2 µm, giving aspect ratios of 2-4. Resolution, depth of the recesses and aspect ratio is preferably designed from case to case. The master structure is a negative copy of the printing plate and can be used to manufacture numerous printing plates. The pattern of the master structure can be transferred to the matrix by replication. Nickel (Ni) is a suitable material for replicated printing plates and plates made of this material are plated on the master. A printing plate manufactured with micro fabrication methods generally does not have the rigidity required for the means for providing product micro features according to the invention. Thus the printing plate is preferably attached to a carrier that provides the necessary rigidity. In the above described roll-to-roll process the printing plate can be attached to the surface of a roll to form the matrix roll.

In a typical matrix roll, one, two or more printing plates are attached together. Typically, the edges are welded, which gives rise to non-usable areas at the matrix roll. However, if the geometrical dimensions of such joints are kept small, the total effect can be limited. In particular embodiments, seamless tools can also be used, where the printing plate is produced directly in a cylindrical shape.

The wear resistance of the matrix roll can be improved by surface treatment, such as hardening and/or deposition of thin wear resistant coatings, for example TiN. Other alternatives of a wear resistant coating can be e.g. diamond-like carbon or chrome nitride. A typical thickness of such a wear resistant coating is 100-120 nm. However, thicknesses in the range 50-300 nm or even 50-500 nm are perfectly useable. The maximum thickness is typically limited by the requested resolution. A thick wear resistant coating adds on material also on the vertical sides of a recess, which modifies the recess pattern. Thick wear resistant coatings also tend to create protruding volumes, in particular in connection with sharp edges, which may make the releasing from the recesses of first curable compound more difficult. The minimum thickness of the wear resistant coating is often set by production economy reasons, since even a covered surface will experience a certain degree of wear.

The wear of the tool depends also to a high degree on the properties of the first curable compound. Corresponding wear resistant coatings could be lasting several times longer for one ink compared to another. For instance, white ink with abrasive $TiO_2$ as a first curable compound was found to cause a high wear.

When the wear resistant coating is worn out, it is possible to perform a reconditioning of the tools. First remaining wear resistant coating is etched away. For TiN coatings, etching liquids such as RCA1 can be used, comprising $NH_4OH$, $H_2O_2$ and $H_2O$. A ratio of 1:2:5 of these components operates well at a temperature of 60° C. However, also other compositions and temperatures will be operable. The Ni surface operates as an efficient etching stop for these liquids, which makes it easy to continue the etching until the surface is free from old coatings. Thereafter a new wear resistant coating can be deposited.

Alternatively or as a complement, nitrogen can be added during the Ni plating step, thereby creating wear resistant nitride materials. The hardness of the Ni surface can be thus be improved. Also other additives, such as phosphorus can be used in this manner to improve the Ni surface hardness by nickel phosphides.

The improvement of the Ni surface can in particular embodiments also be combined with an additional wear resistant coating.

Also in the embodiment of FIG. 5, there is a wetting layer applicator 62, positioned before the second matrix roll 20. This applicator 62 is arranged for providing a thin wetting layer 68 on the substrate 5, thereby modifying the substrate surface 10 before it is contacted with the pickup layer 6. This arrangement has the advantage that it is possible to even further adapt, typically enhance, the adhesion properties between the pickup layer 6 and the substrate 5. By having two substantially continuous layers with appropriate properties on the two surfaces that meet at the entrance to the contact section, the contact pressure can be reduced and the risk for artefacts in the final product can be further reduced. As being obvious from the name, the wetting layer improves the wetting between the pickup layer and the substrate. However, an additional advantage is that the wetting layer also reduces the turbulence of material at the entrance of the contact section. The wetting layer is typically also a curable compound, which eventually is cured together with the second curable compound of the pickup layer and the first curable compound of the printed product micro features to be. The curable compound of the wetting layer may be the same as the first curable compound or the second curable compound or it may be another curable compound. In other words, the manufacturing method comprises the further step of providing the substrate with a wetting surface layer before bringing the matrix in contact with the substrate surface.

In embodiments, where the pickup layer is combined with a wetting layer on the substrate, or where there are two pickup layers on top of each other, the two continuous layers can be used in different combinations for achieving particular advantages. The materials in the two layers can be selected to have different properties, e.g. different optical properties, different viscosity, different adhesion properties, different curing properties etc. In one, non-limiting, example, the pickup layer closest to the actual features can have different refractory index than the surrounding materials. The layer closest to the substrate may then instead be optimized for improving adhesion properties. In another, also non-limiting, example, the pickup layer closest to the actual features can have a relatively high viscosity enabling compensation of variations in e.g. the substrate thickness. In this example, this layer comprises a material having a relatively high degree of polymer. In the layer closest to the substrate, adhesion properties are of more interest and another compound comprising a higher degree of monomers are therefore selected. As anyone skilled in the art understands, this can be varied in numerous ways depending on the intended applications of the final printed product.

This provision of a wetting layer is not exclusively usable with the embodiment of FIG. 5, but can be combined with any other embodiments. Likewise, the main embodiment of FIG. 5 may be performed without the provision of a wetting layer.

In particular embodiments, more than one arrangement 99 for continuous production of a printed product can also be provided on one and the same side of the substrate. Such an arrangement can thereby be used e.g. to print product micro features of different colours. It could also be useful when printing product micro features of so differing shapes or sizes that the use of two different matrixes is favourable.

Such multiple printing units can be combined with any of the previous shown embodiments, for example, but not limited to the embodiments shown in FIGS. 4 and 5.

In one embodiment of the present invention supporting structures are provided in the recesses of the matrix in order to improve filling of large recesses by use of capillary forces.

Figure 6:
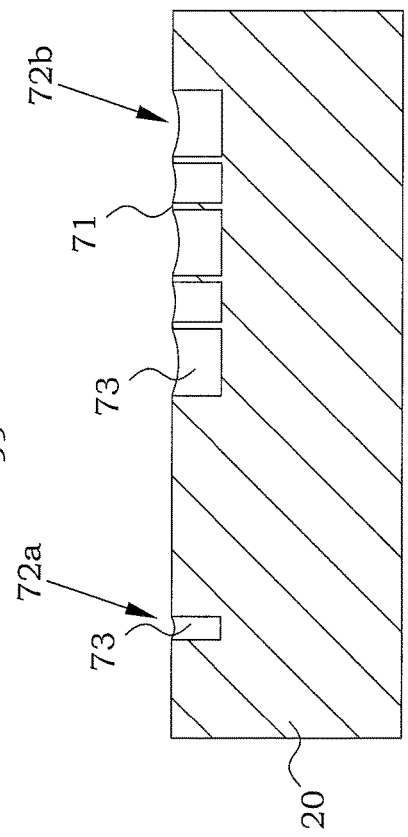
FIG. 6 schematically illustrates supporting structures in large recesses.

FIG. 6 schematically illustrates two recesses 72a, 72b being filled with a curable compound 73. Supporting structures 71, such as pillars or ridges, are provided in the recesses 72A, 72b. Liquid curable compound fills both a small recess 72a and a larger recess 72b. The width of the supporting structures 71 is preferably adapted to be so small that any artefacts in the geometry of the printed product micro features caused by them will not be perceived by an observer when the product is in normal use. The height of the supporting structures 71 typically equal to the depth of the recesses due to fabrication issues, however, is not limited to this. The distance between the supporting structures is adapted so that capillary forces can act on the curable compound filled into the recesses to enable complete filling of the recesses. Preferably, when the printed product micro features are used in optical devices the supporting structures are distributed in a disordered manner to reduce artefacts as if the supporting structures are arranged in an ordered array, small artefacts of the printed product micro features originating from the supporting structures may be perceived in normal use. The supporting structures are preferably positioned randomly or at least varied in such a way that they will not give rise to any moiré effect.

This approach can advantageously be utilized when a pattern of printed product micro features is to be provided, which is dominated by "filled" surfaces, i.e. the matrix comprises mainly "open" surfaces. This is particularly true in embodiments where the parts of the matrix that protrudes between the open areas have small line width, in a preferred embodiment typically below 5 μm. However, in other embodiments, the line width may also be larger than that. If a controlled amount of ink is applied, which does not exceed the volume of the open areas, the surface chemical and physical properties can be adapted so that the ink by itself is collected in the open areas. The ink can thereby be self orienting so as to creep down in the recessed areas, leaving the protruding surfaces substantially free from ink. Typically then, there is no need for any removal of excess ink or polishing. The process can then continue as earlier described, e.g. by pre-curing, covering with a pickup layer and a final curing when applied at a substrate.

In some embodiments, this self-orienting of the ink is facilitated if the line width of the protruding parts is small and if the viscosity of the ink is low. As a non-limiting example, if the depth of the structures is 2 μm, a zone of 2-3 μm from the edge will act to draw the ink down in the structure instead of letting it stay on the top surface. This means that if there is a pattern of lines with a line width of 4-6 μm, the ink, at a properly provided amount, will creep down in the recesses between these protrusions.

On the other hand, the distance between the protruding parts cannot be too large, since the capillary forces attracting the ink towards the edges of the structures than may be too weak. In a tested example where a depth of the structure was 2 μm, a preferred embodiment has a distance between the structures that is typically not larger than typically 10 μm. If the distance in that example becomes much larger than that, the ink tends to stick to the edges, leaving the central part of the recess empty or at least partially empty from ink. A recessed surface of 20 μm therefore suffers from a lack of ink in the middle. If the recessed surface is further increased, the depleted zone comes at an approximate distance of 10-15 µm from the walls, whereas the central part of the recess has remaining ink. However, in other embodiments, where the ink properties, matrix surface properties and depths are different, the maximum distance may also be different. The use randomly positioned support structures may also mitigate such effects.

In order to obtain the above mentioned self-orienting of the ink puts higher demands on the design of the pattern. The patterns are preferably adapted to the differences in surface properties between ink and matrix. The capillary forces in the negative corners of the structures should typically exceed the surface tension that acts for keeping the ink at the surfaces of the protruding parts. In practice, the pattern can not be allowed to involve too large flat protruding surfaces.

Another aspect influencing this self-orienting of the ink is that the surfaces that should capture the ink should preferably not be closed. This means that if e.g. a ring structure is provided with a line width of 4 µm, with a circular hole inside, it may be difficult to fill the hole if it is too small. The ink may be prohibited from entering the hole due to gas bubbles forming, or the hole may be overfilled whereby ink stays on the protrusion surfaces. A preferred way is then to use an open recess pattern over the entire matrix surface. In such a way, an ink wave can be driven within the tool upon contact with the applicator.

This approach with self-orienting ink, removing the need for an excess ink removal step is particularly useful at high speed manufacturing.

The method and the arrangement of the present teachings enable printing of printed product micro features on substrate sheets with high accuracy in printing with respect to lateral resolution, edge definition and dimensional tolerances in three dimensions that is not achievable with conventional printing techniques. Moreover, the method and arrangement allows for continuous processing, which enables this accuracy to be obtained on large surfaces. In particular products comprising printed product micro features ranging in lateral size from 0.5 µm×0.5 µm to centimeter sized features having a height of 0.5 µm to 5 µm, preferably 1 to 3 µm, hence yielding an aspect ratio varying from 4:1 (height:width) to 1:10000, can be formed. The features can for example be as small as 0.5 µm×0.5 µm×2 µm or 1 µm×1 µm×1 µm. As mentioned above, when lateral dimensions vary this much and the product includes µm-sized features, i.e. recesses, the filling of the curable compound is challenging. In order to fill the small recesses the viscosity needs to be comparatively low. This imposes a problem for large recesses since the capillary forces cannot help in filling these large structures. Instead surface tension may play a significant role.

With the use of the pickup layer provided at the matrix roll, the printing speed can be allowed to be high. Favourable tests have been made at different speed with essentially no difference in pattern quality. These test runs are performed without particularly adapting all parameters. By a proper selection of ink properties, pre-curing levels and pattern design, printing speeds of 100-150 cm/s are considered as perfectly feasible.

The present disclose presents solutions for enabling high speed manufacturing of printed products. One contributing aspect is an increased adhesion between the print and the substrate. This in turn improves the possibilities to provide increased resolution and better contrast.

All references to height, width, thickness direction, lateral etc are introduced for the easy of understanding only, and should not be considered as limiting as specific embodiments. Further, the dimensions of the structures in the drawings are not necessarily to scale. For example the size of the product micro features and layer thicknesses are typically strongly exaggerated.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A method for manufacturing a printed product, comprising the steps of:
    a) providing a matrix comprising a matrix surface having a plurality of recesses; and
    b) applying a first curable compound to said matrix surface and said recesses so as to fill said recesses with said first curable compound;
    c) covering said matrix surface and said recesses filled with said first curable compound by a pickup layer of a second curable compound;
    d) bringing said matrix in contact with a substrate surface of a substrate sheet;
    e) curing, at least partly, said first curable compound and said second curable compound; and
    f) separating said matrix surface from said substrate surface, leaving said pickup layer and said first curable compound on said substrate surface;
    wherein said pickup layer and said first curable compound filling said recesses are transferred together from said matrix surface onto said substrate surface; and
    wherein said first curable compound forms printed product micro features at said pickup layer covering said substrate surface.

2. The method according to claim 1, comprising the further step of pre-curing said first curable compound in said recesses before said step of covering said matrix surface and said recesses filled with said first curable compound by a pickup layer.

3. The method according to claim 1, comprising the further step of removing excessive said first curable compound from said matrix surface outside said recesses before said step of covering said matrix surface and said recesses filled with said first curable compound by a pickup layer.

4. The method according to claim 2, comprising the further step of removing excessive said first curable compound from said matrix surface outside said recesses before said step of covering said matrix surface and said recesses filled with said first curable compound by a pickup layer.

5. The method according to claim 4, wherein said step of pre-curing, at least to a part, is performed before said step of removing excessive said first curable compound.

6. The method according to claim 1, wherein said first curable compound is the same as said second curable compound.

7. The method according to claim 1, wherein said first curable compound is different from said second curable compound.

8. The method according to claim 1, comprising the further step of providing said substrate with a wetting surface layer before said step of bringing said matrix in contact with said substrate surface.

9. An arrangement for continuous production of a printed product, comprising:

a matrix roll having a circumferential surface with recesses;

a first applicator arranged for application of a first curable compound onto said matrix roll so as to fill said recesses with said first curable compound;

drive unit arranged for rotating said matrix roll in a rotational direction;

substrate guides, arranged for bringing a substrate sheet in contact with said matrix roll in a contact section;

curing means;

a second applicator, separate from said first applicator, arranged for covering said circumferential surface and said recesses filled with said first curable compound by a pickup layer of a second curable compound;

wherein said contact section is situated, in said rotational direction, after said second applicator;

wherein said pickup layer and said first curable compound are transferred together from said circumferential surface and left on a substrate surface of said substrate sheet;

wherein said first curable compound forms printed product micro features at said pickup layer covering said substrate surface; and said curing means being arranged for curing said first curable compound and said second curable compound;

said curing means being arranged to perform said curing at least to a part in said contact section.

10. The arrangement according to claim 9, further comprising a pre-curing means, arranged for pre-curing said first curable compound in said recesses, said pre-curing means being arranged, in said rotational direction, before said second applicator.

11. The arrangement according to claim 9, further comprising removal means arranged for removal of excessive said first curable compound from said circumferential surface of said matrix roll outside said recesses, said removal means being arranged, in said rotational direction, before said second applicator.

12. The arrangement according to claim 10, further comprising removal means arranged for removal of excessive said first curable compound from said circumferential surface of said matrix roll outside said recesses, said removal means being arranged, in said rotational direction, before said second applicator.

13. The arrangement according to claim 12, wherein said pre-curing means is arranged to perform said pre-curing at least to a part before said removing of excessive said first curable compound.

14. The arrangement according to claim 9, further comprising a wetting layer applicator arranged for providing a wetting layer on said substrate.

15. The method according to claim 2, wherein said first curable compound is the same as said second curable compound.

16. The method according to claim 3, wherein said first curable compound is the same as said second curable compound.

17. The method according to claim 4, wherein said first curable compound is the same as said second curable compound.

18. The method according to claim 5, wherein said first curable compound is the same as said second curable compound.

19. The method according to claim 2, wherein said first curable compound is different from said second curable compound.

20. The arrangement according to claim 10, further comprising a wetting layer applicator arranged for providing a wetting layer on said substrate.

* * * * *